United States Patent [19]

Stark et al.

[11] Patent Number: 4,786,359
[45] Date of Patent: Nov. 22, 1988

[54] XENON ENHANCED PLASMA ETCH

[75] Inventors: Mark M. Stark, Kamakura; Shu Nakajima, Fujisawa, both of Japan; Roger B. Lachenbruch, Sausalito, Calif.

[73] Assignee: Tegal Corporation, Petaluma, Calif.

[21] Appl. No.: 65,746

[22] Filed: Jun. 24, 1987

[51] Int. Cl.[4] .............................................. C03C 15/00
[52] U.S. Cl. ........................... 156/643; 156/646; 156/662; 156/668; 204/192.37
[58] Field of Search ............... 156/643, 646, 662, 668, 156/345; 252/793; 204/192.37

[56] References Cited

U.S. PATENT DOCUMENTS

| 4,375,385 | 3/1983 | Hanlon | 156/643 |
| 4,468,285 | 8/1984 | Bayman et al. | 156/657 |
| 4,547,260 | 10/1985 | Takada et al. | 156/643 |
| 4,582,581 | 4/1986 | Flanigan et al. | 156/662 |
| 4,592,801 | 6/1986 | Hara et al. | 156/643 |
| 4,615,764 | 10/1986 | Bobbio et al. | 156/653 |

FOREIGN PATENT DOCUMENTS

| 58-56338 | 4/1983 | Japan. | |
| 58-12583 | 7/1983 | Japan. | |
| 0007632 | 1/1986 | Japan | 156/345 |

Primary Examiner—David L. Lacey
Assistant Examiner—Lori A. Johnson
Attorney, Agent, or Firm—Paul F. Wille

[57] ABSTRACT

A plasma etch process and apparatus is disclosed in which a gas mixture comprises $CF_3Br$, xenon or krypton, and oxygen. The plasma reactor includes a sacrificial element, preferably in the form of a graphite ring, on the lower electrode of a parallel plate reactor.

5 Claims, 1 Drawing Sheet

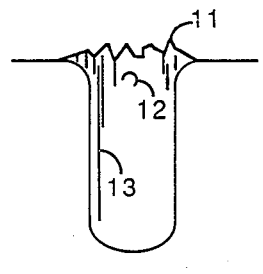
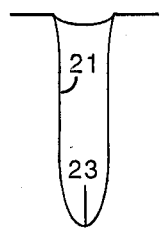
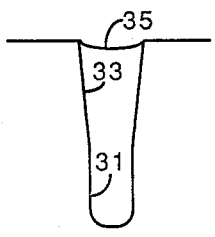
FIG. 1
(Prior art)
FIG. 2
FIG. 3
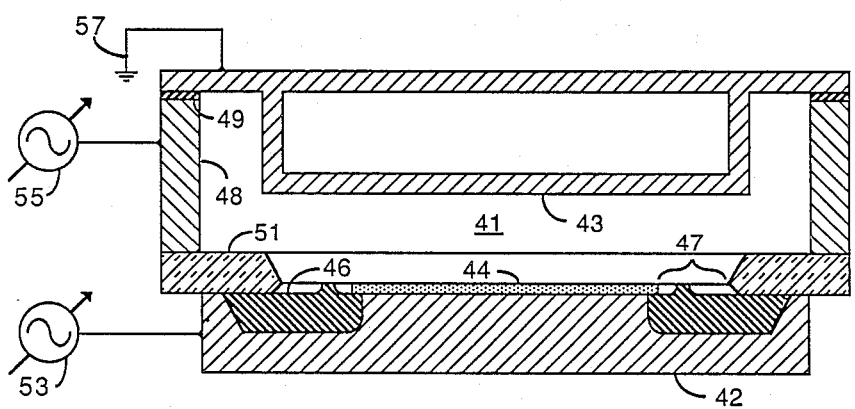
FIG. 4

XENON ENHANCED PLASMA ETCH

BACKGROUND OF THE INVENTION

This invention relates to processes employing a plasma or glow discharge and, in particular, to plasma etching utilizing xenon as one component of the gas mixture in the plasma.

As known in the art, plasma etching involves complex chemical and physical processes, and a certain amount of luck, in producing desired results. The parametric balance in a glow discharge is delicate. Modifying one parameter, e.g. pressure, may produce several changes, of which only one or two are desired. For example, increased pressure can cause polymer deposition in an etch machine.

It is well known in the art to isolate devices on a semiconductor wafer by way of a trench surrounding the devices. In order to assure isolation, the trenches are relatively deep, e.g. on the order of 3 to 15 microns. It is also desired that the trench be relatively uniform in shape and have vertical or nearly vertical sidewalls.

For shallow grooves, i.e. less than 3 microns deep, it is relatively easy to obtain a groove of uniform depth with vertical or nearly vertical, smooth sidewalls. For trenches, it is more difficult to produce the desired geometry. Further, producing a trench should not entail an etch time of two or three times that required to etch a groove. However, as known in the art, it is difficult to increase etch rate without sacrificing uniformity, either in depth or in the shape of the sidewalls. Typically, high speed etches result in rough surfaces and trenches which may bow or have a barrel cross-section. In addition, it is important that the trenches have vertical or nearly vertical sidewalls since devices which have already been formed on the wafer are often critically spaced. Thus, the trench should not change size, shape or position with depth. This is sometimes referred to as "loss of critical dimension".

In the prior art, $CF_3Br$ has been proposed for etching silicon (J. Vac. Sci. Technol. 17(6), November/December 1980, p. 1341f and IBM Technical Disclosure Bulletin, Vol. 24 No. 9, February 1982, p. 4725f) or titanium (J. Electrochem. Soc.: SOLID-STATE SCIENCE AND TECHNOLOGY, Nov. 1977, p. 1766f) in a plasma reactor. A difficulty with this particular gas is the tendency to deposit polymer in the plasma reactor. The difficulty with polymer formation is that it changes the electrical characteristics of the chamber as well as the chemistry of the process being performed therein. In addition, the polymer coating can become a source of particle contamination on the wafer.

Another difficulty is that the etch profile is very dependent upon the flow of $CF_3Br$. This renders etch profile difficult to control. This problem can be acute, particularly for newer, high density structures. For example, megabit and higher density memories are constructed using what is known as a trench capacitor, which requires an anisotropic etch profile on small features in the monocrystalline silicon wafer. The control of geometry is particularly difficult on submicron features and deep trenches because ion-molecule collisions cause scattering of the ions, producing concave etch profiles and reduced etch rates. One proposed solution to the problem has been to use low pressure etching systems. However, etch rate and throughput are reduced in low pressure processes.

In view of the foregoing it is therefore an object in accordance with one aspect of the present invention to provide a process for forming trenches having a controlled etch profile.

A further object, in accordance with another aspect of the present invention, is to provide an improved plasma etch resulting in reduced polymer deposition within the plasma chamber.

Another object of the present invention is to provide an improved reactor having a sacrificial structure with erodes during the etch process to prevent polymer buildup in the reactor chamber.

A further object of the present invention is to provide a means for improving control of ion production and bombardment in a process using plasma.

SUMMARY OF THE INVENTION

The foregoing objects are achieved in the present invention wherein the etch is performed using a gas mixture comprising $CF_3Br$, xenon or krypton, and oxygen. In addition, the plasma reactor is provided with a graphite ring, in the lower electrode, which erodes during the process. By utilizing a triode, multiple frequency reactor at relatively high pressure and manipulating the ion energy, gas dissociation, and current by way of the applied frequencies, one obtains an improved etch rate and, for trenches, control of the etch profile even with fine geometry structures. Also, one increases uptime by reducing the frequency of chamber cleans.

BRIEF DESCRIPTION OF THE DRAWINGS

A more complete understanding of the present invention can be obtained by considering the following detailed description in conjunction with the accompanying drawings, in which:

FIG. 1 illustrates a trench etched with $CF_3Br$ only.

FIG. 2 illustrates a trench etched with a gas mixture including xenon.

FIG. 3 illustrates a trench etch with a gas mixture comprising xenon and oxygen in a reactor having a sacrificial element.

FIG. 4 illustrates a preferred embodiment of a plasma reactor in accordance with the present invention.

DETAILED DESCRIPTION OF THE INVENTION

FIG. 1 illustrates the results of using $CF_3Br$ gas alone, as has been done in the prior art. While this etch gas produces a relatively deep, wide trench, the surface of the trench is rough as indicated by jagged opening 11 and texture 13. In addition, clumps of silicon or other material, as indicated by reference numeral 12, are also produced using $CF_3Br$ alone.

In accordance with one aspect of the present invention, illustrated in FIG. 2, the etch gas comprises $CF_3Br$ and xenon. It is believed that the addition of xenon enables one to better control the transfer of kinetic energy within the plasma discharge. The apparent result of the addition of xenon is a reduced dependency of the etch rate upon the flow of $CF_3Br$. As illustrated in FIG. 2, the resultant trench produced by this gas combination results in noticeably smoother sidewalls 21 and a somewhat V-shaped etch profile as indicated by reference numeral 23.

In accordance with another aspect of the present invention, as illustrated in FIG. 3, oxygen is added to the mixture of $CF_3Br$ and xenon. The oxygen appears to assist in the ionization of the CF₃Br, i.e. the production of bromine ions, as well as reducing the deposition of by-products on the silicon wafer. In addition, etch taper 33 is readily controlled by the proportion of the gases and a uniform taper is produced as well as a flatter bottom to the trench as indicated by reference numeral 31. As with FIG. 2, the trench intersects the surface of the silicon wafer with a smooth edge.

FIG. 4 illustrates a preferred embodiment of a plasma reactor in accordance with the present invention wherein a consumable ring is utilized to minimize the sensitivity of the process to the exposed area of the wafer. That is, the consumable element loads the reactor so that the particular wafer being etched has a much smaller influence on process parameters. Implicitly, the process must be changed somewhat to accommodate the consumable element. However, having done so, one achieves a much more stable and repeatable process, as well as increased uptime.

In particular, a plasma reactor in accordance with the present invention comprises chamber 41 formed by lower electrode 42 and upper electrode 43, as well as sidewall 48. Upper electrode 43 comprises a plurality of passageways, not shown, known per se in the art, for supplying and exhausting gases as well as providing cooling for the upper electrode. Similarly, lower electrode 42 can comprise suitable passageways, known per se in the art, for controlling the temperature thereof. Upper electrode 43, because it contains the reactive gases, is preferably connected to ground 57. Sidewall 48 is connected to a source of RF energy 55, which preferably comprises a signal having a frequency of 13.56 MHz. Lower electrode 42 is connected to a second source of RF energy, which preferably produces a signal at a frequency of 100 KHz. Lower electrode 42 is isolated from sidewall 48 by an insulating ring 51. Sidewall 48 is isolated from upper electrode 43 by insulating ring 49.

Lower electrode 42 has an annular groove formed therein into which is inserted ring 46. Semiconductor wafer 44 rests on a central portion of lower electrode 42 and is surrounded by ring 46 so that no portion of lower electrode 42 is exposed to the plasma discharge within chamber 41.

In accordance with the present invention, ring 46 preferably comprises a carbon bearing material such as organic compounds or graphite. Most high temperature plastics appear suitable although some, e.g. "ARDEL" (commercially available from Union Carbide) etch more quickly than other plastics, e.g. "TORLON" (commercially available from Amoco) or "ENVEX" (commercially available from Rodgers Corp.). The former material is a polyarylate, while the latter two are polyimides. Alternatively, the ring can be made from graphite, a graphite compound, or a graphite coated ceramic.

Ring 46 has a width such that it extends from underneath wafer 44 to underneath insulator 51. However, insulator 51 has a large central aperture such that an annular exposed portion 47 of ring 46 can come in contact with the plasma discharge within volume 41.

In operation, it has been found, in accordance with the present invention, that the addition of xenon gas greatly reduces the sensitivity of the etch to the flow of CF₃Br. In addition, the xenon gas reduced the sensitivity of the process to the amount of exposed area on wafer 44. Previously, wafers with a large exposed area of silicon showed a more tapered etch profile in the trench portion, even at high flows of CF₃Br. Correspondingly, wafers with very small exposed areas of silicon tended to have concave, negative profiles, indicative of too great a gas flow. By the addition of xenon gas, this sensitivity to the flow of CF₃Br is greatly reduced. In addition, the addition of xenon magnifies the effect of the 100 KHz power on etch profile. This is believed to result from a balancing of deposition and etching occurring on the sidewall of the etch. The effect of the xenon is different from that of merely a diluent. The xenon is believed to affect the kinetic energies of the molecules in the chamber, as indicated by the increased effectiveness of the 100 KHz power. Thus the effect of xenon is different from that of helium or argon, inert diluents of the prior art. Krypton, which is less massive than xenon, can be used instead of xenon with similar results.

The addition of oxygen to the mixture further enhanced the etch process and reduced the formation of a polymer film on the interior of the reactor chamber. For example, in comparison tests, etching with CF₃Br required a chamber cleaning every 30 to 100 wafers. Etching with a mixture of CF₃Br, xenon, and oxygen in a chamber having a sacrificial element, showed that at least 200 wafers could be etched before the chamber had to cleaned.

As previously noted, the consumable ring provided a loading mechanism which reduced the dependency of the process upon the amount of exposed silicon. While the consumable element preferably comprises an organic ring, it is understood that any suitable element, exposed to the plasma discharge can serve as the consumable element.

In a series of tests performed using a reactor constructed as illustrated in FIG. 4, on 125 mm. wafers using a silicon dioxide mask with 100 KHz RF power coupled to lower electrode 42 and 13.56 MHz power coupled to sidewall 48, one obtained an etch rate of from 6000 to 7000 angstroms per minute with a selectivity of from 8:1 to 13:1. The gas flows in these tests comprised 1.5 SCCM CF₃Br, 1.0 SCCM Xe and from 1 to 3 SCCM oxygen. The 13.56 MHz signal had a power of 400 watts while the 100 KHz signal had a power of 225 watts. The outer diameter of the exposed area of ring 46 was approximately 150 mm.

As a further example, a gas mixture comprising 3.2 SCCM oxygen, 1.5 SCCM CF₃Br, and 1.0 SCCM xenon at a pressure of 0.45 torr provided consistently superior results. In the latter example, the 100 KHz signal had an applied power of 180 watts.

There is thus provided by the present invention of an improved method and apparatus for performing trench etches. Not only is a trench obtained having the desired profile for subsequent processing, e.g. formation of a trench capacitor, but machine downtime is reduced by reducing polymer deposition on the walls of the chamber during the trench etch.

Having thus described the invention, it will be apparent to those of ordinary skill in the art that various modifications can be made within the scope of the present invention. For example, as previously noted, the particular embodiment of the sacrificial element is not critical so long as the surface of the sacrificial element is contacted by the plasma discharge. The connections of the RF power supplies and ground as illustrated in FIG. 4 are preferred but are not the only configuration which can be used. The power level is not critical and is readily determined empirically for a given wafer size and chamber construction. Similarly, the pressure within the reactor chamber is not critical, although higher pressures increase etch rate. A range of from 0.1 to 0.7 torr has been found useful.

We claim:

1. A process for etching a silicon wafer comprising the steps of:

providing a gas mixture comprising $CF_3Br$ and xenon or krypton;

contacting said wafer with a plasma formed from said mixture; and eroding a carbon bearing object with said plasma for at least a portion of the time said plasma contacts said wafer.

2. The process as set forth in claim 1 wherein said gas mixture is supplied at a pressure of 0.1–0.7 torr.

3. The process as set forth in claim 1 wherein said mixture comprises approximately equal flows of $CF_3Br$ and xenon or krypton.

4. The process as set forth in claim 1 wherein said mixture further comprises oxygen.

5. The process as set forth in claim 4 wherein the flow of oxygen is equal to or greater than the combined flows of $CF_3Br$ and xenon or krypton.

* * * * *